(12) United States Patent
Lee

(10) Patent No.: US 9,172,368 B1
(45) Date of Patent: Oct. 27, 2015

(54) CONTACTLESS ROTARY PULL SWITCH

(71) Applicant: Eaton Corporation, Cleveland, OH (US)

(72) Inventor: Davin Robert Lee, Watertown, WI (US)

(73) Assignee: Eaton Corporation, Cleveland, OH (US)

( * ) Notice: Subject to any disclaimer, the term of this patent is extended or adjusted under 35 U.S.C. 154(b) by 26 days.

(21) Appl. No.: 14/244,187

(22) Filed: Apr. 3, 2014

(51) Int. Cl.
*H01H 36/00* (2006.01)
*H03K 17/97* (2006.01)
*H01H 25/06* (2006.01)
*B60Q 1/14* (2006.01)

(52) U.S. Cl.
CPC .............. *H03K 17/97* (2013.01); *B60Q 1/1461* (2013.01); *H01H 25/06* (2013.01); *H01H 36/00* (2013.01); *H01H 36/004* (2013.01); *H01H 36/008* (2013.01); *H01H 2219/036* (2013.01); *H01H 2221/01* (2013.01); *H03K 2217/94068* (2013.01)

(58) Field of Classification Search
CPC ....... H03K 17/97–17/972; H03K 2217/94068; H01H 25/06–25/065; H01H 2221/01; H01H 2219/036; H01H 36/00–36/02; B60Q 1/1461
USPC ........................ 335/205–207; 338/32 R, 32 H
See application file for complete search history.

(56) References Cited

U.S. PATENT DOCUMENTS

| | | |
|---|---|---|
| 4,789,826 A | 12/1988 | Willett |
| 5,159,268 A | 10/1992 | Wu |
| 5,444,370 A | 8/1995 | Wu |
| 5,754,042 A | 5/1998 | Schroeder et al. |
| 6,057,682 A | 5/2000 | McCurley et al. |
| 6,659,630 B2 | 12/2003 | Becker |
| 7,023,202 B2 | 4/2006 | Hagino et al. |
| 2002/0167815 A1 | 11/2002 | Becker |
| 2007/0074956 A1 | 4/2007 | Koehler et al. |

FOREIGN PATENT DOCUMENTS

| | | |
|---|---|---|
| EP | 1770864 A1 | 4/2007 |
| EP | 2261938 A2 | 12/2010 |

OTHER PUBLICATIONS

Hall-Effect IC Applications Guide, copyright 1987-2013, Allegro MicroSystems, LLC, pp. 1-40.

*Primary Examiner* — Ramon Barrera
(74) *Attorney, Agent, or Firm* — Ziolkowski Patent Solutions Group, SC

(57) ABSTRACT

A contactless rotary pull switch includes a switch knob assembly rotatable about an axis to a plurality of rotational positions and actuatable to at least one pull position, with the switch knob assembly including a knob element and a rotational shaft fixedly coupled thereto. A rotational magnet is coupled to the rotational shaft so as to rotate therewith, and at least one pull magnet is positioned separately from the rotational magnet. A rotational sensor senses a magnetic field generated by the rotational magnet to identify a rotational position of the switch knob assembly and at least one pull sensor senses a magnetic field generated by the pull magnet (s) to identify a pull position of the switch knob assembly. A rotatable arm member selectively enables/inhibits sensing of the magnetic field generated by the pull magnet(s) by the at pull sensor(s), to identify distinct pull positions of the switch knob assembly.

20 Claims, 5 Drawing Sheets

CONTACTLESS ROTARY PULL SWITCH

BACKGROUND OF THE INVENTION

Embodiments of the invention relate generally to rotary pull switches and, more particularly, to contactless rotary pull switches such as might be used as lighting switches for a motor vehicle.

In specialty vehicle markets—such as heavy trucks, agricultural equipment, and construction equipment, for example—various types of electrical switches are used as control switches for a variety of applications, including general vehicle features/applications (e.g., switching the motor vehicle lighting, the windshield wipers, the rear windshield heating, the cruise control functions, etc., on and off) and critical or safety related vehicle features/applications (e.g., power take-off (PTO) switches, "e-stop" type switches, etc.). With respect to a vehicle lighting switch in particular, a typical vehicle lighting switch includes a rotary control having at least three positions: all lights (parking lamps and headlamps) OFF, parking lamps ON, and all lights ON. The vehicle lighting switch may also incorporate an auto-light function, and two pull-on functions for turning ON fog lamps.

The typical rotary pull vehicle lighting switch includes mechanically engageable contacts (e.g., wiping contacts) for controlling all of the vehicle lighting functions/modes—with a sensing or determination of a rotational position and pull position being achieved via such mechanically engageable contacts. While such rotary pull switches having mechanically engageable contacts are most often employed in vehicle lighting switches, it is recognized that vehicle lighting switches may also be constructed as contactless rotary pull switches. Such contactless rotary pull switches may operate by rotating a magnet past a fixed magnetic sensor, such as a Hall effect IC or a magnetoresistive sensor. It is also known to make a contactless switch that operates using the Wiegand effect.

With respect to contactless rotary pull switches that are utilized in vehicle lighting switches or in switches for other applications, it is recognized that existing designs of such switches can limit the performance thereof. For example, existing contactless rotary pull switches often incorporate a single magnet or arrangement of magnets—in conjunction with a number of sensors—for determining both the rotational position of the switch and the pull position of the switch. In such an arrangement, the pull position is determined by sensing the strength of a magnetic field of the magnet by way of a pull position sensor—with the strength of the magnetic field varying as a distance between the magnet and the pull position sensor increases/decreases. However, these variations in the magnetic field strength may not be great enough to discern a distinct switching position. As another example of limited performance, the circuit board in existing contactless rotary pull switches—and light emitting diodes (LEDs) included on the circuit board for providing backlighting to symbols on the face of the switch—are often located at a back portion of the switch module at a distance from the vehicle dashboard. As such, mechanisms such as optical fibers or light pipes are necessary for transmitting light from the LEDs to the symbols on the face of the switch, thereby increasing the cost and complexity of the switch.

It would therefore be desirable to provide a contactless rotary pull switch—such as might be utilized for controlling of vehicle lighting—that provides distinct switching positions and increased durability. It would further be desirable for such a rotary pull switch to utilize low cost and efficient lighting to provide backlighting for lighted symbols on the face of the switch.

BRIEF DESCRIPTION OF THE INVENTION

Embodiments of the present invention provide a contactless rotary pull switch that provides for robust sensing of both the rotational position and the pull position of the switch.

In accordance with one aspect of the invention, a contactless rotary pull switch includes a switch knob assembly that is rotatable about an axis to a plurality of rotational positions and that is actuatable to at least one pull position, with the switch knob assembly including a knob element and a rotational shaft fixedly coupled to the knob element. The contactless rotary pull switch also includes a first magnet coupled to the rotational shaft so as to rotate therewith responsive to a rotation of the knob element, at least one additional magnet positioned separately from the first magnet, a first magnetic sensor configured to sense a magnetic field generated by the first magnet to identify a rotational position of the switch knob assembly, at least one additional magnetic sensor configured to sense a magnetic field generated by the at least one additional magnet to identify a pull position of the switch knob assembly, and an arm member rotatable between a number of positions to selectively enable and inhibit sensing of the magnetic field generated by the at least one additional magnet by the at least one additional magnetic sensor, so as to identify distinct pull positions of the switch knob assembly.

In accordance with another aspect of the invention, a contactless rotary pull switch includes a housing having a base joined to a bottom portion thereof and a face joined to a top portion thereof and a switch knob assembly positioned partially within the housing, the switch knob assembly further including a knob element that is that is rotatable about an axis to a plurality of rotational positions and that is actuatable to at least one pull position and a rotational shaft fixedly coupled to the knob element so as to rotate along with the knob element. The contactless rotary pull switch also includes a rotational position magnet secured to the rotational shaft so as to rotate therewith responsive to a rotation of the knob element, at least one pull position magnet positioned separately from the switch knob assembly and the rotational position magnet, a rotational position sensor unit configured to sense a magnetic field generated by the rotational position magnet to determine a rotational position of the knob element, and at least one pull position sensor configured to sense a magnetic field generated by the at least one pull position magnet to determine a pull position of the knob element. The rotational position magnet is further secured to the rotational shaft such that the rotational position magnet is fixedly positioned in an axial direction, such that a distance between the rotational position magnet and the rotational position sensor unit is kept constant during actuation of the knob element to different pull positions.

In accordance with yet another aspect of the invention, a contactless rotary pull switch for controlling operation of one or more devices in a motor vehicle includes a switch knob assembly that is rotatable about an axis to a plurality of rotational positions and that is movable along the axis to at least one pull position, with the switch knob assembly further including a knob element actuatable by an operator and a rotational shaft fixedly coupled to the knob element so as to rotate and axially translate with the knob element responsive to an actuation thereof, the rotational shaft including an end member formed thereon at an end distal from the knob element. The contactless rotary pull switch also includes a multi-pole ring magnet secured to the rotational shaft so as to rotate therewith responsive to a rotation of the knob element, at least one pull position magnet positioned separately from the rotational position magnet, a plurality of magnetic sensors positioned to sense magnetic fields generated by the multi-pole ring magnet and the at least one pull position magnet to determine a rotational position and pull position of the switch knob assembly, and an arm member driven by an axial movement of the end member so as to be rotatable between a number of positions to selectively enable and inhibit sensing of the magnetic field generated by the at least one pull position magnet by one or more of respective magnetic sensors, so as to identify distinct pull positions of the switch knob assembly.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE INVENTION

Embodiments of the invention are directed to a contactless rotary pull switch that utilizes magnetic sensing for both the rotary position and the pull position of the switch, so as to provide robust sensing of the rotary position and pull position. While a contactless rotary pull switch is described below with respect to its use as a vehicle lighting switch, it is recognized that the switch may be instead be used in other applications according to embodiments of the invention. Accordingly, it is to be understood that embodiments of the invention are not limited for use as vehicle lighting switches or for use in vehicles in general and that use of embodiments of the invention for other applications is understood to be within the scope of the invention.

Figure 1:
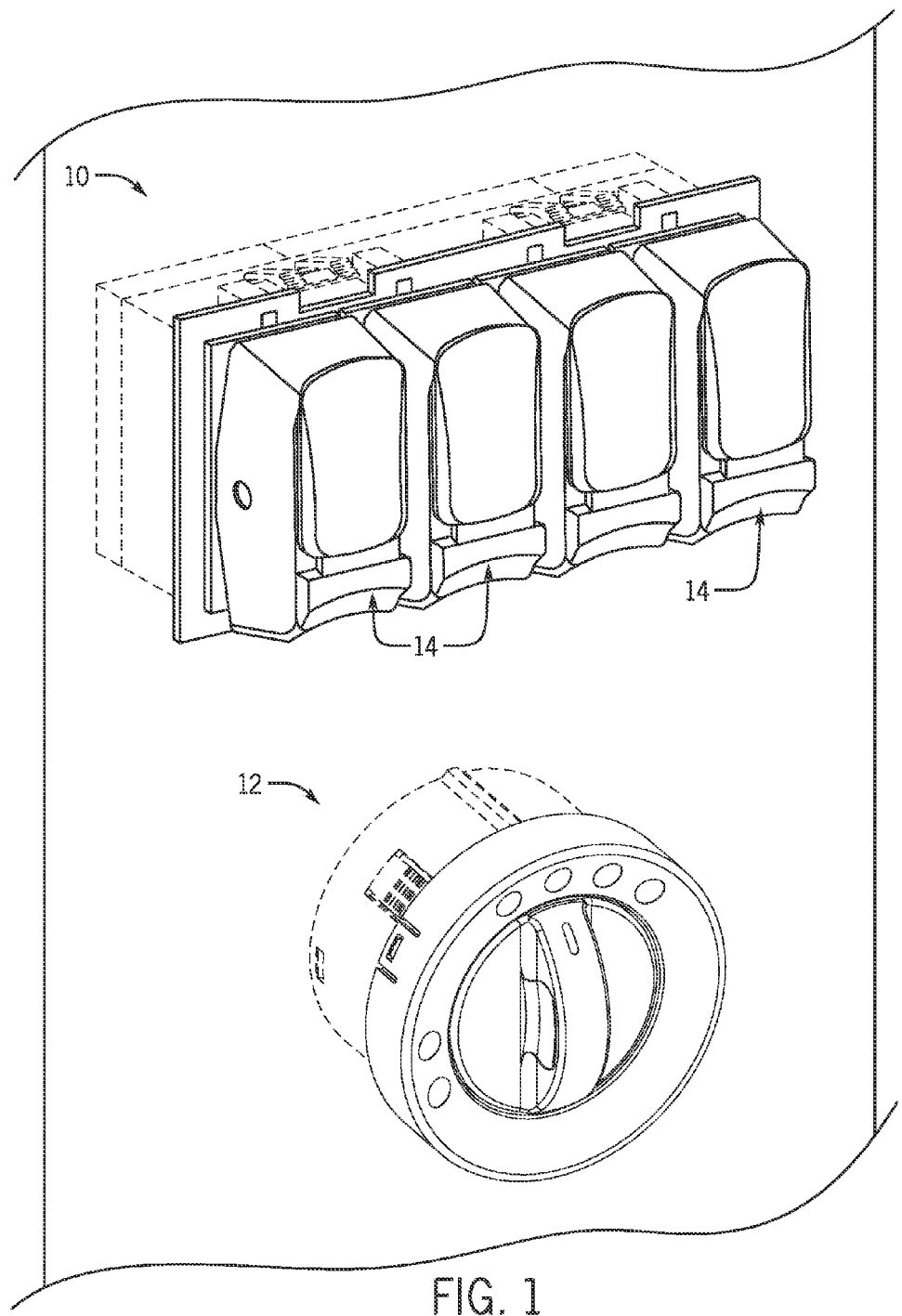
FIG. 1 shows a partial view of a vehicle dashboard including an arrangement of vehicle control switches, according to an embodiment of the invention.

Referring to FIG. 1, the general layout of a portion of a vehicle dashboard 10 is shown such as might be useable with embodiments of the invention. The dashboard 10 includes a contactless rotary pull switch 12 and other vehicle control switches 14—here shown as rocker switches—that are incorporated as part of the dashboard 10 in a motor vehicle, such as a heavy truck, goods vehicle, agricultural equipment, or construction equipment, for example. According to one embodiment, an operator of the vehicle may use the contactless rotary pull switch 12 to control the vehicle lighting and the vehicle control switches 14 to control other various functions in the vehicle, such as for switching the windshield wipers, the diesel fuel heating, or controlling other specialized equipment on the vehicle—such as a power take-off (PTO), for example. When the contactless rotary pull switch 12 is used as a vehicle lighting switch, different rotational and pull positions of the switch can selectively control the operation of the vehicle lighting—including, for example, rotational positions for turning all lights (parking lights and headlights) OFF, parking lights ON, and all lights ON, and one or more pull positions for turning ON fog lamps.

While the contactless rotary pull switch 12 is described above as being a vehicle lighting switch, it is recognized that the rotary pull switch 12 could be used to control other vehicle features—with the rotary pull switch being used as a temperature control in a different embodiment of the invention, for example. It is further recognized that additional rotary pull switches 12 and vehicle control switches 14 could be included on the dashboard 10, and thus the number and arrangement of switches illustrated in FIG. 1 is meant to be an example only and is not meant to limit the scope of the invention in any regard.

Figure 2:
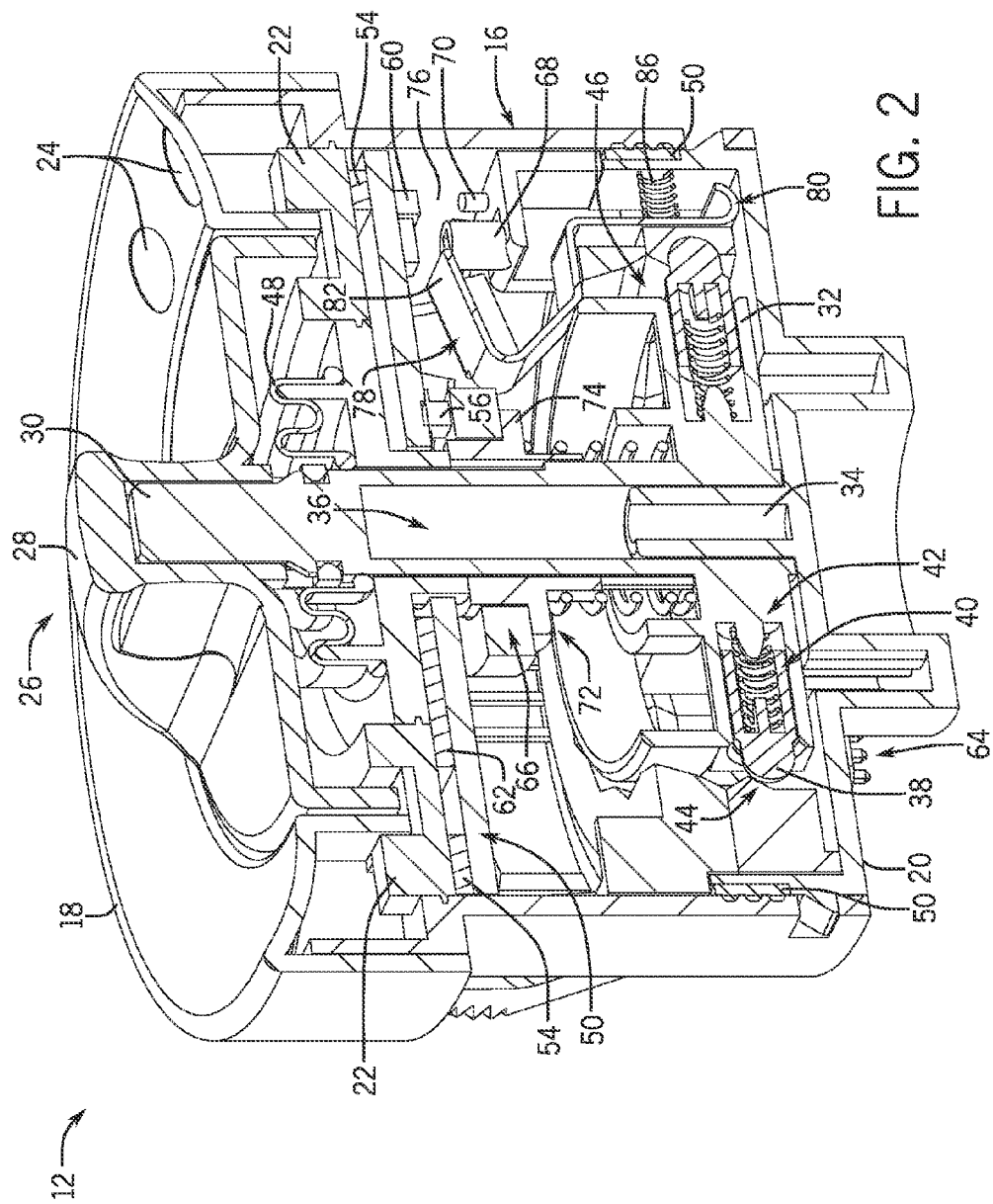
FIG. 2 is a cross-sectioned view of a contactless rotary pull switch that can be incorporated in the vehicle dashboard of FIG. 1, according to an embodiment of the invention.

Referring now to FIG. 2, the structure of the contactless rotary pull switch 12 is shown in greater detail, according to an exemplary embodiment. As shown in FIG. 2, the rotary pull switch 12 includes a switch housing 16, with a cover or face 18 positioned at a front of the housing 16 and a back plate or base 20 positioned at a rear of the housing 16. According to one embodiment, the switch 12 includes a number of clear lenses 22 positioned into the housing 16 adjacent the face 18 that allow for transmission of light therethrough to illuminate symbols or indicia 24 on the face 18 to indicate different modes of the switch 12, with the symbols/indicia 24 being backlightable via one or more light sources housed in the switch, as will be discussed in greater detail below. The clear lenses 22 are molded into the housing 16 to provide a waterproof face 18 on switch 12. It is recognized, however, that lenses 22 need not be included in the housing 16 of switch 12 in an embodiment where the switch is not a sealed/waterproof switch, and that the lenses 22 may be removed in such an embodiment with these locations on the face 18 remaining open.

Switch 12 also includes a switch knob assembly 26 that is actuatable by an operator via both a rotational movement and pull/push movement. The switch knob assembly 26 is positioned and arranged so as to be supported by portions of both the base 20 and the housing 16, with the support provided to the switch knob assembly 26 enabling rotation thereof relative to the housing 16 and base 20. The switch knob assembly 26 includes a knob element 28 that is positioned within the ring-shaped face and extends outwardly therefrom such that is can be grasped and actuated by the operator. Affixed to the knob element 28 is a rotational shaft 30 that rotates in tandem with the knob element 28 when the knob element 28 is actuated. The rotational shaft 30 extends down into the housing 16 of the switch 12 and is rotatable and displaceable relative to the housing 16 and the base 20. Movement of the switch knob assembly 26 thus includes rotation about the axis 36 relative to the base 20, and movement along the axis 36 relative to the base 20, with—according to one embodiment of the invention—the movements of the switch knob assembly 26 controlling, in a manner described below, energization of various lights in the vehicle.

As shown in FIG. 2, an end member 32 is formed on the rotational shaft 30 at an end thereof adjacent base 20, and the end member 32 is positioned over a protrusion 34 of the base 20 that extends upwardly therefrom, so as to maintain the rotational shaft 30 in alignment with the base 20 along an axis 36 of the shaft. According to an exemplary embodiment, the end member 32 is a circular member having an increased circumference than the rotational shaft, such that the end member 32 extends radially outward from the shaft. The end member 32 has a flange formed along the outer circumference thereof, with the flange extending upwards (i.e., toward the face) from a back surface of the end member.

According to one embodiment of the invention, an arrangement of opposing plungers 38 and springs 40 are positioned within cavities 42 formed in the end member 32 of rotational shaft 30. The arrangement of opposing plungers 38 and springs 40 interact with an arrangement of radial detents 44 formed in the base 20 to distinguish a plurality of rotational switching positions. Circumferential detents 46 are also formed on base 20 in the axial direction, with the circumferential detents 46 interacting with the same plungers 38 and springs 40 to provide distinct momentary or sustained pull positions for the switch 12.

While switch 12 is shown as including an arrangement of radial detents 44 formed in the base 20 that interact with the plungers/springs 38, 40 for aiding in distinguishing between a plurality of rotational switching positions, it is recognized that such radial detents 44 are not required in the switch 12, according to other embodiments. That is, an embodiment of the switch 12 may be made without the radial detents 44 so as to provide a smooth rotation of knob element 28—such as might be desired for a temperature control switch.

Also according to an embodiment of the invention, the switch 12 is constructed as a sealed, water-tight switch. In order to seal the switch 12, a number of seals are included—including a seal 48 positioned around the rotational shaft 30 (i.e., "front shaft seal"), a seal 50 positioned between the housing 16 and base 20, and the previously mentioned insert-molded lenses 22 in the housing 16. The front shaft seal 48 is constructed so as to allow rotational and axial movement of the shaft 30 without interfering with switch function.

As further shown in FIG. 2, switch 12 also includes a circuit board 50 (i.e., printed circuit board (PCB)) fixedly positioned within the switch 12. The circuit board 50 is secured within the switch 12, such as by being mounted to housing 16, and is positioned adjacent the face 18 (and thus adjacent to the vehicle dashboard 10, FIG. 1). In order to provide for positioning adjacent the face 18, the circuit board 50 includes an opening 52 therein through which the rotational shaft 30 of switch knob assembly 26 may pass.

Included on the circuit board 50 are one or more light emitting diodes (LEDs) 54 that provide illumination for the switch 12. The LEDs 54 may be mounted on the circuit board 50 so as to be located directly beneath the face 18 of the device, with the LEDs 54 being aligned with the clear lenses 22 to illuminate the symbols/indicia 24 included thereon. By mounting the circuit board 50 adjacent the face 18 of the switch 12—including the positioning of the LEDs 54 directly beneath the clear lenses 22 of the housing 16—the LEDs 54 are able to provide brighter and more efficient lighting for the symbols/indicia 24 on the face 18 than if the LEDs 54 were located adjacent the base 20 of the switch 12, as in existing contactless rotary pull switches.

Also included on the circuit board 50 is a plurality of magnetic sensors that function to detect and determine the rotary and pull positions of the switch 12. According to an exemplary embodiment, and as shown in FIG. 2, an arrangement of sensors is provided on the circuit board 50 that enable determining of the rotational and pull positions of the switch 12 with the arrangement of sensors including a rotational sensor unit 56 and pull sensors 58, 60. The sensors 56, 58, 60 may be provided as Hall effect sensors that are used as a proximity switch that turn ON when a magnet pole approaches the sensor and turn OFF when the pole recedes a predetermined distance, or may be provided as magnetoresistive (MR) sensors that exhibit a measurable change in resistance in the presence of a magnetic field (e.g., anisotropic magnetoresistive (AMR) sensors). According to one embodiment, the rotational sensor unit 56 is comprised of two Hall effect sensors that are oriented with an offset of 90° from each other in order to detect different rotational switching positions of the switch knob assembly 26.

According to one embodiment, the circuit board 50 may still further include control circuitry (e.g., controller or microprocessor) thereon, generally indicated at 62, that is in operable communication with the sensors 56, 58, 60. The control circuitry 62 is operative to read the outputs of the sensors 56, 58, 60 and, in response, generate output signals that control operation of devices in the vehicle, such as a lighting system (not shown), including headlamps, parking lamps, and fog lamps, for example. The control circuitry 62 may function as a multiplex communication device (using a CAN or LIN protocol, for example) to interface with other devices or a vehicle controller (not shown), or it can output signals directly to an external controller (not shown). Communication between the control circuitry 62 and other devices/controllers outside of switch 12 is provided by terminal contacts 64 provided on/in the base 20 of the switch.

Referring still to FIG. 2, the switch 12 also includes a number of magnets positioned within housing 16 that work in conjunction with the magnetic sensors 56, 58, 60 to provide for detecting/determining the rotary and pull positions of the switch 12. In an exemplary embodiment, three magnets are included in the switch—with the magnets being a magnet for determining a rotational position of the switch 12—i.e., a "rotational magnet" 66—and magnets for determining a pull/push position of the switch 12—i.e., "pull magnets" 68, 70.

In the illustrated embodiment, the rotational magnet 66 is a multi-pole ring magnet that encircles the rotational shaft 30 and is positioned adjacent the circuit board 50 on a side thereof facing the base 20 of the switch 12. The rotational magnet 66 is mounted to the rotational shaft 30 by way of a sleeve member 72, with the sleeve member 72 being positioned about the rotational shaft 30 and coupled thereto. The sleeve member 72 includes a flange 74 formed thereon that provides support to the rotational magnet 66. The sleeve member 72 is coupled to the rotational shaft 30 in such a fashion that the sleeve member 72 and the rotational magnet 66 rotate when the switch knob assembly 26 is rotated. However, the sleeve member 72 is further coupled to the rotational shaft 30 in such a fashion that the rotational shaft 30 is slideable therein, such that rotational magnet 66 does not move axially when the switch knob assembly 26 is moved vertically to one of the pull positions. Accordingly, the rotational magnet 66 is maintained in a stationary position in the axial direction regardless of the pull position of the switch knob assembly 26. The axial spacing between the rotational magnet 66 and the rotational sensor unit 56 is thus kept constant, thereby providing for more robust sensing of the rotational position since the magnetic field strength is not affected by the pull functions of the switch 12.

In operation, the switch knob assembly 26 is rotated to one of a plurality of rotational positions, with each one of the rotational positions corresponding to a selected condition of vehicle illumination. In rotating the switch knob assembly 26, the rotational magnet 66 is also caused to rotate such that the poles of the rotational magnet 66 are reoriented. Due to the arrangement of the sensors in rotational sensor unit 56 (i.e., two Hall effect sensors), a rotation of the switch knob assembly 26—and accompanying rotation of the rotational magnet 66—causes a sinusoidal signal to be generated as each pole of the magnet is rotated under the rotational sensor unit 56. The out-of-phase sensors (i.e., 90° offset between sensors) in the rotational sensor unit 56 are able to determine a unique rotational position of the switch knob assembly 26 from the sinusoidal signal.

With regard to the pull magnets 68, 70 in the switch 12, the pull magnets 68, 70 are formed as magnets that are separate from the rotational magnet 66. As shown in FIG. 2, the pull magnets 68, 70 are of smaller size than the rotational magnet 66, with the magnets being constructed as a cylindrical or rectangular magnet of a size that is similar to that of pull sensors 58, 60, for example. The pull magnets 68, 70 are positioned radially outward from the rotational shaft 30 such that a magnetic field generated thereby does not overlap with the field generated by the rotational magnet 66 and is not sensed by the rotational sensor unit 56. The pull magnets 68, 70 are mounted in a stationary position relative to the pull sensors 58, 60 and are separated therefrom by a gap 76 of a suitable distance.

Rotary pull switch 12 also includes an arm member 78 therein that functions to enable sensing of distinct pull positions in the switch 12. In the embodiment of FIG. 2, arm member 78 is constructed as a vane member that is selectively movable to control the magnetic field that is sensed by the pull sensors 58, 60. The vane member 78 is formed of a ferrous material that is selectively movable to a number of distinct positions in the gap 76 between the pull sensors 58, 60 and the pull magnets 68, 70, with the ferrous material of the vane member 78 acting to interrupt the magnetic field between the pull magnets 68, 70 and the pull sensors 58, 60 in a controlled fashion, as will be described in greater detail below. The vane member 78 is positioned within housing 16 and is held in position by features on the base 20 in a manner that allows for the vane member 78 to pivot or rotate about a pivot point—generally indicated at 80.

In operation, the vane member 78 is driven by the end member 32 on the rotational shaft 30 responsive to axial movement of the end member 32, with the circumferential flange on the end member 32 pressing upwardly on the vane member when the switch knob assembly is axially translated. More specifically, the vane member 78 is driven to rotate on its own axis (i.e., pivot about point 80) responsive to an axial movement of the end member 32 that is caused by a pull/push actuation of the switch knob assembly 26 by an operator—with an end flange 82 on the vane member 78 moving to a number of distinct locations in the gap 76 between the pull sensors 58, 60 and the pull magnets 68, 70 responsive to the rotation about the point 80. The mounting of the vane member 78 relative to the base 20 and the manner in which it is driven by end member 32 of rotational shaft 30 allow for the pull magnets 68, 70 and pull sensors 58, 60 to identify numerous pull positions of the switch knob assembly 26 at any rotational position of the switch knob assembly 26. The selective interrupting of the magnetic field provided by the vane member 78 causes the strength of the magnetic field that is sensed by pull sensors 58, 60 to drop to zero (or near zero), and this large reduction in the strength of the magnetic field sensed by pull sensors 58, 60 provides for the identification of distinct and robust switch pull positions.

Figure 3:
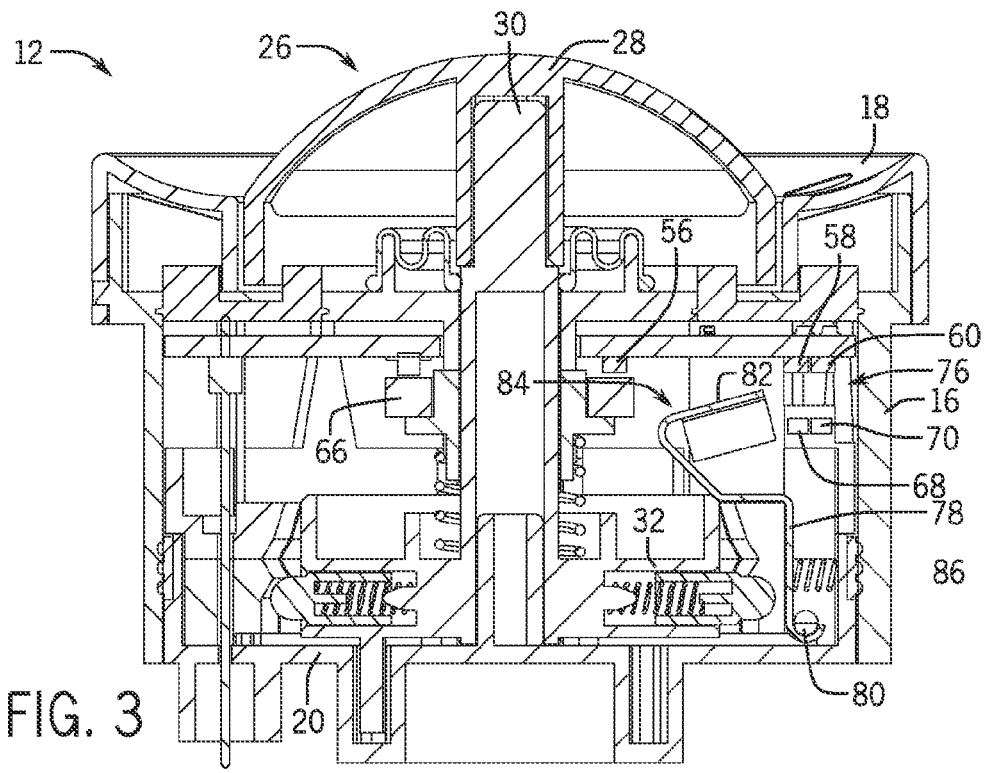
FIG. 3 is a view of the contactless rotary pull switch of FIG. 2 in an initial pull position.
Figure 4:
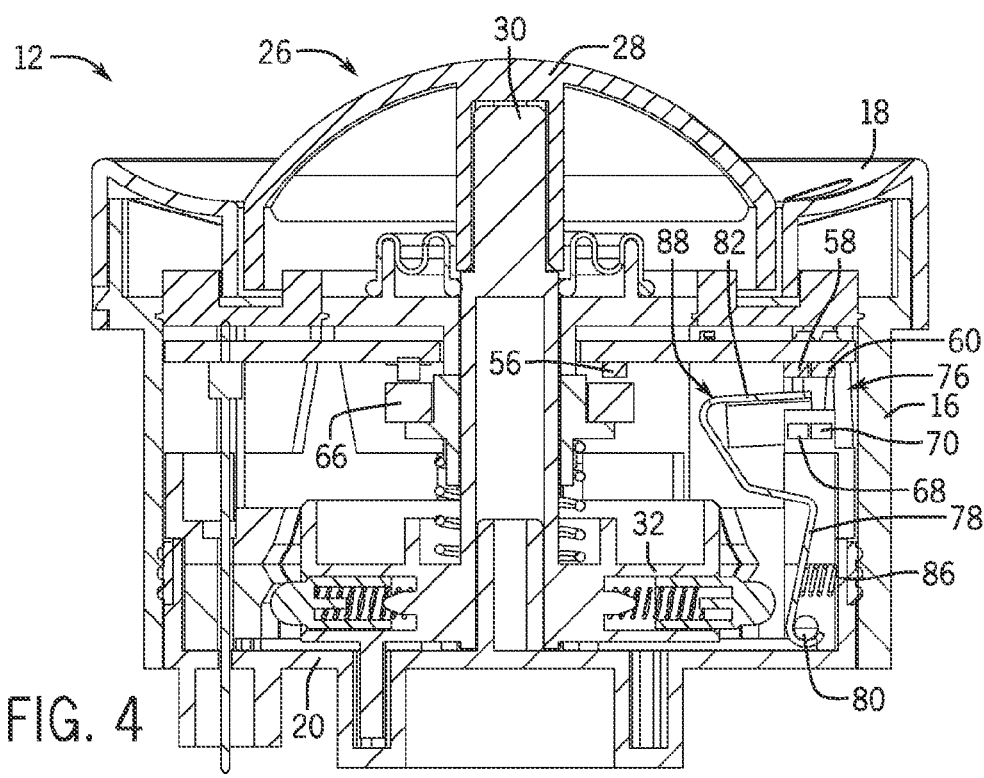
FIG. 4 is a view of the contactless rotary pull switch of FIG. 2 in a first pull position.
Figure 5:
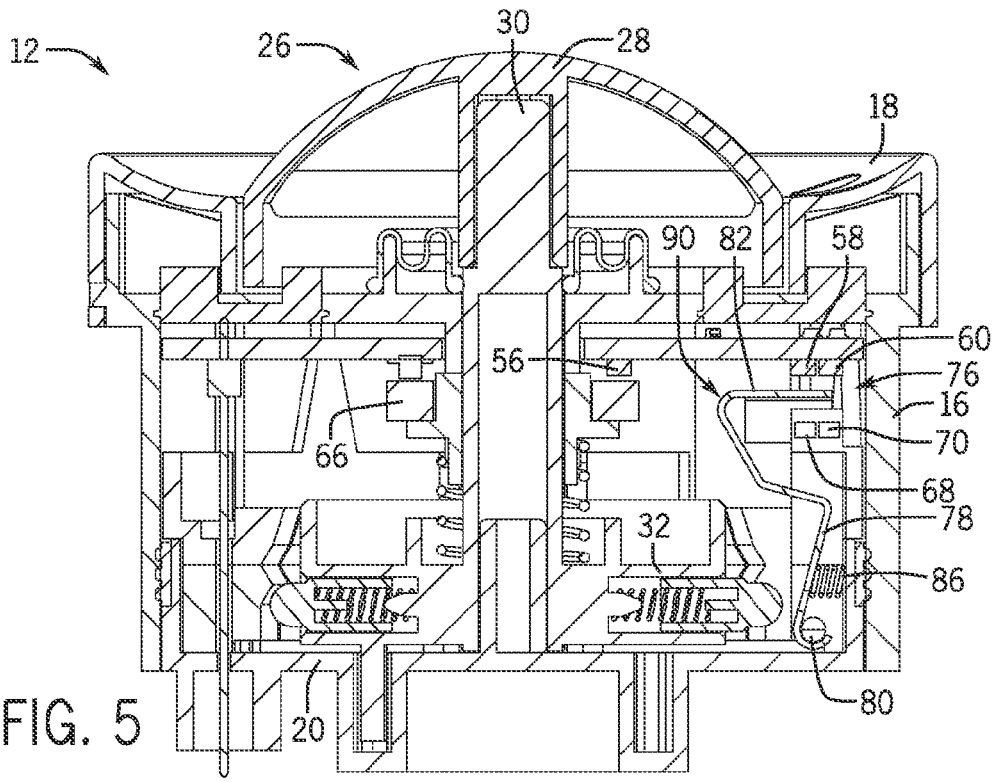
FIG. 5 is a view of the contactless rotary pull switch of FIG. 2 in a second pull position.

Referring now to FIGS. 3-5, the positioning of the switch 12 in each of three distinct pull or push positions is shown, according to an embodiment of the invention. An initial pull position of the switch 12 is first shown in FIG. 3 where the switch knob assembly 26 is fully depressed (i.e., not pulled out). In this initial pull position, the end member 32 of the rotational shaft 30 is not acting on the vane member 78 (i.e., no rotation of the vane member 78 is caused by end member 32) and the vane member 78 is maintained in an original or base position 84 by way of a spring 86 mounted on the base 20. While in the original or base position 84, the end flange 82 of the vane member 78 is positioned outside of the gap 76 between the pull magnets 68, 70 and the pull sensors 58, 60. Accordingly, the magnetic field generated by each pull magnet 68, 70 is sensed by its respective pull sensor 58, 60, such that both sensors are activated by the magnetic field.

A first pull position of the switch 12 is next shown in FIG. 4 where the switch knob assembly 26 is pulled out to a first distinct position—as provided by the interaction between the circumferential detents 46 on base 20 and the plungers/springs 38, 40 in end member 32. In the first pull position, the end member 32 of the rotational shaft 30 acts on the vane member 78 so as to drive the vane member 78 to a first rotational position 88. While in the first rotational position 88, the end flange 82 of the vane member 78 is positioned in the gap 76 between the pull magnets 68, 70 and the pull sensors 58, 60 at a location that interrupts or blocks the magnetic field between pull 68 magnet and pull sensor 58. Accordingly, the magnetic field generated by pull magnet 68 is not sensed by pull sensor 58, while the magnetic field generated by pull magnet 70 is sensed by pull sensor 60—such that only one pull sensor 60 is activated while the other pull sensor 58 is turned off.

A second pull position of the switch 12 is next shown in FIG. 5 where the switch knob assembly 26 is pulled out to a second distinct position—as provided by the interaction between the circumferential detents 46 on base 20 and the plungers/springs 38, 40 in end member 32. In the second pull position, the end member 32 of the rotational shaft 30 acts on the vane member 78 so as to drive the vane member 78 to a second rotational position 90. While in the second rotational position 90, the end flange 82 of the vane member 78 is positioned in the gap 76 between the pull magnets 68, 70 and the pull sensors 58, 60 at a location that interrupts or blocks the magnetic field between both pull magnets 68, 70 and their respective pull sensors 58, 60. Accordingly, the magnetic field generated by each of pull magnets 68, 70 is not sensed by pull sensors 58, 60—such that both pull sensors 58, 60 are turned off.

Figure 6:
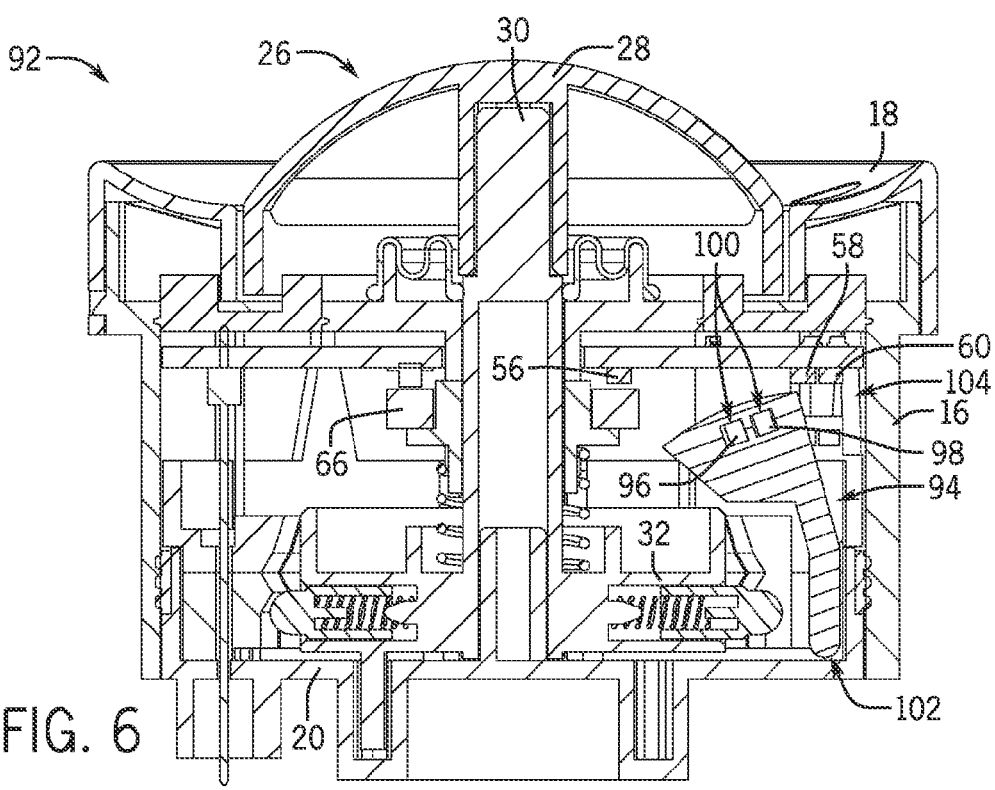
FIG. 6 is a perspective view of a contactless rotary pull switch that can be incorporated in the vehicle dashboard of FIG. 1, with the switch in an initial pull position, according to another embodiment of the invention.
Figure 7:
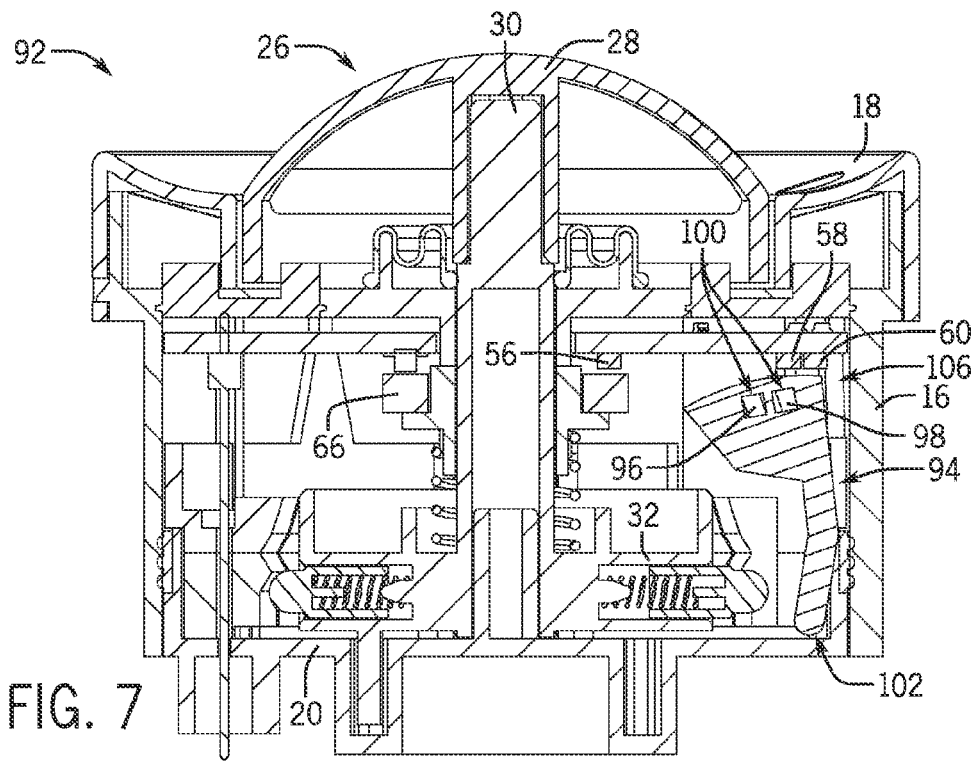
FIG. 7 is a view of the contactless rotary pull switch of FIG. 6 in a first pull position.
Figure 8:
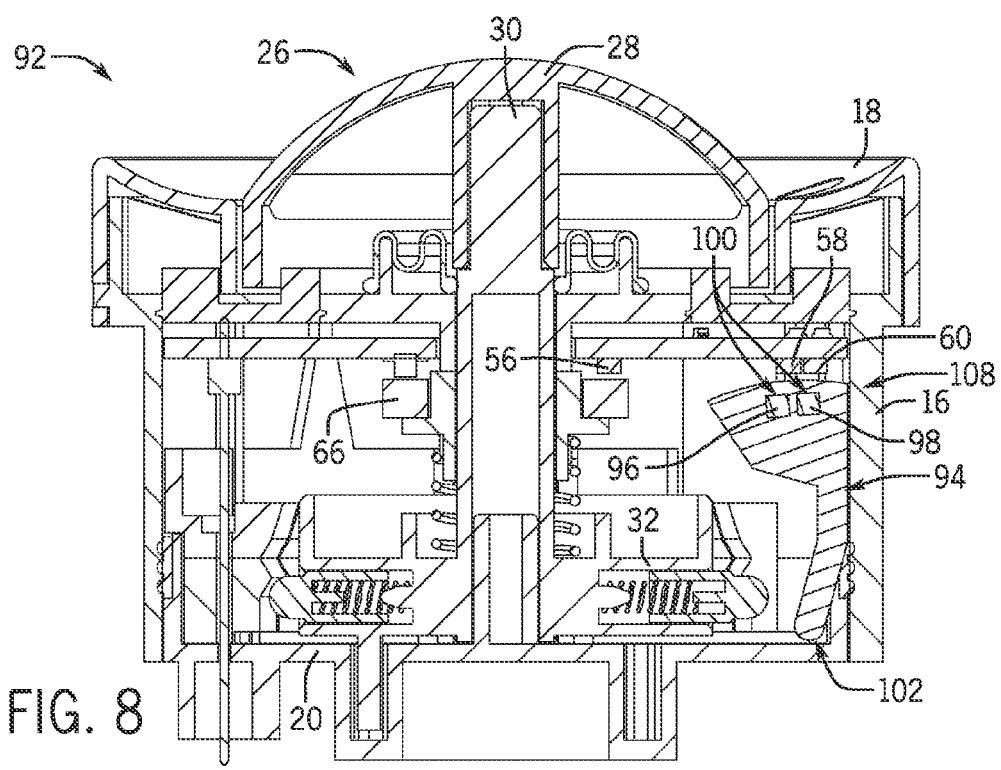
FIG. 8 is a view of the contactless rotary pull switch of FIG. 6 in a second pull position.

Referring now to FIGS. 6-8, a contactless rotary pull switch 92 of different construction is shown, according to another embodiment of the invention. The general structure of switch 92 is similar to the switch 12 shown and described above in FIGS. 2-5—with the housing 16, face 18, switch knob assembly 26, and circuit board 50 (including rotation and pull sensors 58, 60 thereon) of the switch 92 having an identical or substantially similar construction to the housing 16, face 18, and switch knob assembly 26 of switch 12. Accordingly, these like elements are numbered identically to those in switch 12. However, the pull magnets 68, 70 and vane member 78 of the switch 12 in FIGS. 2-5 are replaced in switch 92 by pull magnets 96, 98 and an accompanying arm member 94 that—in the embodiment of FIGS. 6-8—is constructed as a non-ferrous moveable magnet holder.

As shown in FIGS. 6-8, the moveable magnet holder 94 includes receptacles 100 formed therein that receive permanent magnets (i.e., pull magnets 96, 98) therein. The moveable magnet holder 94 is positioned within housing 16 and is held in position by features on the base 20 in a manner that allows for the moveable magnet holder 94 to pivot or rotate about a pivot point—generally indicated at 102. The moveable magnet holder 94 is driven by the end member 32 on the rotational shaft 30 responsive to axial movement of the end member 32. More specifically, the moveable magnet holder 94 is driven to rotate about point 102 responsive to an axial movement of the end member 32 that is caused by a pull/push actuation of the switch knob assembly 26 by an operator—with rotation of the moveable magnet holder 94 causing a corresponding movement of the pull magnets 96, 98 to one of a number of distinct positions relative to the pull sensors 58, 60. The moveable magnet holder 94, and the manner in which it is driven by end member 32 of rotational shaft 30, allow for the identification of numerous pull positions of the switch knob assembly 26 at any rotational position of the switch knob assembly 26.

An initial pull position of the switch 92 is first shown in FIG. 6 where the switch knob assembly 26 is fully depressed (i.e., not pulled out). In this initial pull position, the end member 32 of the rotational shaft 30 is not acting on the moveable magnet holder 94 (i.e., no rotation of the moveable magnet holder 94 is caused by end member 32) and the moveable magnet holder 94 is thus oriented in a base position 104. While in the base position 104, the moveable magnet holder 94 holds the pull magnets 96, 98 in a position distal from the pull sensors 58, 60 such that the magnetic field generated by the pull magnets 96, 98 is not sensed by the pull sensors 58, 60, and the pull sensors 58, 60 identify an OFF position.

A first pull position of the switch 92 is next shown in FIG. 7 where the switch knob assembly 26 is pulled out to a first distinct position—as provided by the interaction between the circumferential detents 46 on base 20 and the plungers/springs 38, 40 in end member 32. In the first pull position, the end member 32 of the rotational shaft 30 acts on the moveable magnet holder 94 so as to drive the moveable magnet holder 94 to a first rotational position 106. While in the first rotational position 106, the moveable magnet holder 94 positions pull magnet 98 directly under pull sensor 58, such that pull sensor 58 detects a large increase in magnetic field so as to identify an ON position. However, in the first pull position 106, pull magnet 96 is still positioned away from the pull sensors 58, 60 such that the magnetic field generated by the pull magnet 96 is not sensed by pull sensor 60—and thus pull sensor 60 still identifies an OFF position.

A second pull position of the switch 92 is next shown in FIG. 8 where the switch knob assembly 26 is pulled out to a second distinct position—as provided by the interaction between the circumferential detents 46 on base 20 and the plungers/springs 38, 40 in end member 32. In the second pull position, the end member 32 of the rotational shaft 30 acts on the moveable magnet holder 94 so as to drive the moveable magnet holder 94 to a second rotational position 108. While in the second rotational position, the moveable magnet holder 94 positions each of the pull magnets 96, 98 directly under a respective pull sensor 58, 60, such that each pull sensor 58, 60 detects a large increase in magnetic field so as to identify an ON position (i.e., both pull sensors 58, 60 identify an ON position).

While the switches 12, 92 shown in FIGS. 2-5 and in FIGS. 6-8—and the shown/described operational states thereof—are described as employing two pull magnets 68, 70/96, 98 and pull sensors 58, 60 for identifying numerous pull positions of the switch knob assembly 26, it is recognized that another embodiment of the switches 12, 92 might include only a single pull magnet and pull sensor. That is, for a switch where only a single pull position is required/desired, the switch can be configured to include only a single pull magnet and pull sensor. Furthermore, while the switches 12, 92 shown in FIGS. 2-5 and in FIGS. 6-8—and the shown/described operational states thereof—are described as identifying numerous pull positions, it is recognized that multiple push positions could instead by recognized using a similar arrangement of magnets and sensors.

Beneficially, embodiments of the invention thus provide a contactless rotary pull switch that provides for robust sensing of both the rotational position and the pull position of the switch. The contactless rotary pull switch is constructed such that the multi-pole magnet used for sensing the rotational position is maintained in a fixed axial position that does not change responsive to a change in pull position of the switch. This maintaining of the multi-pole magnet in a fixed axial position enables the rotational position sensor to always sense a strong magnetic field when determining the rotational position of the switch, regardless of the pull position. According to one embodiment, the contactless rotary pull switch is further constructed to include a ferrous vane that moves to selectively interrupt the magnetic field between the pull position magnets and the pull position sensors. By interrupting the magnetic field between the pull position magnets and the pull position sensors as opposed to gradually increasing/decreasing a strength of the magnetic field detected by the sensors (by increasing a distance gap between the magnets and sensors), more distinct pull positions can be identified.

As an additional benefit of the invention, the contactless rotary pull switch provides for bright, efficient lighting of symbols/indicia on the switch face by being constructed to accommodate the switch circuit board and accompanying LEDs adjacent the switch face rather than at a rear of the switch. As yet another benefit of the invention, the contactless rotary pull switch is constructed as a water proof switch, using an arrangement of seals provided at locations in the switch housing and a waterproof face to provide protection to the switch.

Therefore, according to one embodiment of the present invention, a contactless rotary pull switch includes a switch knob assembly that is rotatable about an axis to a plurality of rotational positions and that is actuatable to at least one pull position, with the switch knob assembly including a knob element and a rotational shaft fixedly coupled to the knob element. The contactless rotary pull switch also includes a first magnet coupled to the rotational shaft so as to rotate therewith responsive to a rotation of the knob element, at least one additional magnet positioned separately from the first magnet, a first magnetic sensor configured to sense a magnetic field generated by the first magnet to identify a rotational position of the switch knob assembly, at least one additional magnetic sensor configured to sense a magnetic field generated by the at least one additional magnet to identify a pull position of the switch knob assembly, and an arm member rotatable between a number of positions to selectively enable and inhibit sensing of the magnetic field generated by the at least one additional magnet by the at least one additional magnetic sensor, so as to identify distinct pull positions of the switch knob assembly.

According to another embodiment of the present invention, a contactless rotary pull switch includes a housing having a base joined to a bottom portion thereof and a face joined to a top portion thereof and a switch knob assembly positioned partially within the housing, the switch knob assembly further including a knob element that is that is rotatable about an axis to a plurality of rotational positions and that is actuatable to at least one pull position and a rotational shaft fixedly coupled to the knob element so as to rotate along with the knob element. The contactless rotary pull switch also includes a rotational position magnet secured to the rotational shaft so as to rotate therewith responsive to a rotation of the knob element, at least one pull position magnet positioned separately from the switch knob assembly and the rotational position magnet, a rotational position sensor unit configured to sense a magnetic field generated by the rotational position magnet to determine a rotational position of the knob element, and at least one pull position sensor configured to sense a magnetic field generated by the at least one pull position magnet to determine a pull position of the knob element. The rotational position magnet is further secured to the rotational shaft such that the rotational position magnet is fixedly positioned in an axial direction, such that a distance between the rotational position magnet and the rotational position sensor unit is kept constant during actuation of the knob element to different pull positions.

According to yet another embodiment of the present invention, a contactless rotary pull switch for controlling operation of one or more devices in a motor vehicle includes a switch knob assembly that is rotatable about an axis to a plurality of rotational positions and that is movable along the axis to at least one pull position, with the switch knob assembly further including a knob element actuatable by an operator and a rotational shaft fixedly coupled to the knob element so as to rotate and axially translate with the knob element responsive to an actuation thereof, the rotational shaft including an end member formed thereon at an end distal from the knob element. The contactless rotary pull switch also includes a multi-pole ring magnet secured to the rotational shaft so as to rotate therewith responsive to a rotation of the knob element, at least one pull position magnet positioned separately from the rotational position magnet, a plurality of magnetic sensors positioned to sense magnetic fields generated by the multi-pole ring magnet and the at least one pull position magnet to determine a rotational position and pull position of the switch knob assembly, and an arm member driven by an axial movement of the end member so as to be rotatable between a number of positions to selectively enable and inhibit sensing of the magnetic field generated by the at least one pull position magnet by one or more of respective magnetic sensors, so as to identify distinct pull positions of the switch knob assembly.

The present invention has been described in terms of the preferred embodiment, and it is recognized that equivalents, alternatives, and modifications, aside from those expressly stated, are possible and within the scope of the appending claims.

What is claimed is:

1. A contactless rotary pull switch comprising:
    a switch knob assembly that is rotatable about an axis to a plurality of rotational positions and that is actuatable to at least one pull position, the switch knob assembly including a knob element and a rotational shaft fixedly coupled to the knob element;
    a first magnet coupled to the rotational shaft so as to rotate therewith responsive to a rotation of the knob element;
    at least one additional magnet positioned separately from the first magnet;
    a first magnetic sensor configured to sense a magnetic field generated by the first magnet to identify a rotational position of the switch knob assembly;
    at least one additional magnetic sensor configured to sense a magnetic field generated by the at least one additional magnet to identify a pull position of the switch knob assembly; and
    an arm member rotatable between a number of positions to selectively enable and inhibit sensing of the magnetic field generated by the at least one additional magnet by the at least one additional magnetic sensor, so as to identify distinct pull positions of the switch knob assembly.

2. The contactless rotary pull switch of claim 1 further comprising a sleeve member to couple the first magnet to the rotational shaft, wherein the sleeve member is constructed so as to cause the first magnet to rotate with the rotational shaft responsive to a rotation of the knob element and to maintain the first magnet in a fixed axial position during actuation of the switch knob assembly to different pull positions, such that a distance between the first magnet and the first magnetic sensor is kept constant during actuation of the switch knob assembly to different pull positions.

3. The contactless rotary pull switch of claim 1 wherein the switch knob assembly further comprises an end member positioned on the rotational shaft at an end thereof distal from the knob element, the end member driving the arm member to rotate responsive to actuation of the switch knob assembly to the at least one pull position.

4. The contactless rotary pull switch of claim 3 wherein the arm member comprises a ferrous vane member rotatable between a number of positions to selectively position an end flange of the vane member in a gap between the at least one additional magnet and the at least one additional magnetic sensor, the ferrous vane member interrupting the magnetic field between the at least one additional magnet and the at least one additional magnetic sensor.

5. The contactless rotary pull switch of claim 4 wherein the at least one additional magnet comprises a second magnet and a third magnet, and the at least one additional magnetic sensor comprises a second magnetic sensor and a third magnetic sensor; and
    wherein the ferrous vane member is rotatable between:
        a base position where neither the magnetic field between the second magnet and the second magnetic sensor or the magnetic field between the third magnet and the third magnetic sensor is interrupted by the end flange of the ferrous vane member;
        a first rotational position where the magnetic field between the second magnet and the second magnetic sensor is interrupted by the end flange of the ferrous vane member; and
        a second rotational position where both the magnetic field between the second magnet and the magnetic field between second magnetic sensor and between the third magnet and the third magnetic sensor are interrupted by the end flange of the ferrous vane member.

6. The contactless rotary pull switch of claim 3 wherein the arm member comprises a non-ferrous moveable magnet holder rotatable between a number of positions, wherein the at least one additional magnet is housed within a receptacle formed in the non-ferrous moveable magnet holder such that the at least one additional magnet rotates with the non-ferrous moveable magnet holder.

7. The contactless rotary pull switch of claim 6 wherein the at least one additional magnet comprises a second magnet and a third magnet, and the at least one additional magnetic sensor comprises a second magnetic sensor and a third magnetic sensor; and
    wherein the non-ferrous moveable magnet holder is rotatable between:
        a base position where neither of the magnetic fields generated by the second and third magnets is sensed by the second magnetic sensor or the third magnetic sensor;

a first rotational position where one of the magnetic fields generated by the second and third magnets is sensed by a respective one of the second magnetic sensor or the third magnetic sensor; and a second rotational position where the respective magnetic fields generated by the second and third magnets are sensed by the second magnetic sensor and the third magnetic sensor.

8. The contactless rotary pull switch of claim 1 further comprising:

a housing generally enclosing components of the contactless rotary pull switch;

a face positioned at a front of the housing and including one or more symbols or indicia thereon; and a base positioned at a rear of the housing and including a protrusion formed thereon that is positioned within the rotatable shaft to provide support and alignment thereto.

9. The contactless rotary pull switch of claim 8 further comprising a circuit board positioned within the housing and adjacent the face, the circuit board including the first sensor and the at least one additional sensor mounted thereon and one or more light emitting diodes (LEDs) mounted thereon, with the LEDs positioned adjacent the symbols or indicia of the face to provide backlighting thereto.

10. The contactless rotary pull switch of claim 1 wherein the first magnet comprises a multi-pole ring magnet, and wherein the first magnetic sensor identifies a rotational position of the switch knob assembly based on a rotational position of the multi-pole ring magnet relative to the first magnetic sensor.

11. The contactless rotary pull switch of claim 1 wherein the contactless rotary pull switch is integrated into a vehicle dashboard of a motor vehicle, and wherein the contactless rotary pull switch comprises a vehicle lighting switch.

12. A contactless rotary pull switch comprising:

a housing having a base joined to a bottom portion thereof and a face joined to a top portion thereof;

a switch knob assembly positioned partially within the housing, the switch knob assembly comprising:

a knob element that is that is rotatable about an axis to a plurality of rotational positions and that is actuatable to at least one pull position; and a rotational shaft fixedly coupled to the knob element so as to rotate along with the knob element;

a rotational position magnet secured to the rotational shaft so as to rotate therewith responsive to a rotation of the knob element;

at least one pull position magnet positioned separately from the switch knob assembly and the rotational position magnet;

a rotational position sensor unit configured to sense a magnetic field generated by the rotational position magnet to determine a rotational position of the knob element; and at least one pull position sensor configured to sense a magnetic field generated by the at least one pull position magnet to determine a pull position of the knob element;

wherein the rotational position magnet is further secured to the rotational shaft such that the rotational position magnet is fixedly positioned in an axial direction, such that a distance between the rotational position magnet and the rotational position sensor unit is kept constant during actuation of the knob element to different pull positions.

13. The contactless rotary pull switch of claim 12 wherein the switch knob assembly further comprises an end member secured on the rotational shaft at an end thereof distal from the knob element, the end member moving axially along the axis responsive to actuation of the switch knob assembly to different pull positions.

14. The contactless rotary pull switch of claim 13 further comprising a ferrous vane member drivable by the end member to rotate between a number of positions and selectively position an end flange of the vane member in a gap between the at least one pull position magnet and the at least one pull position sensor, the end flange selectively interrupting the magnetic field between the at least one pull position magnet and the at least one pull position sensor to enable identification of distinct pull positions of the switch knob assembly.

15. The contactless rotary pull switch of claim 14 wherein the at least one pull position magnet comprises a pair of pull position magnets and the at least one pull position sensor comprises a pair of pull position sensors, with the end flange of the ferrous vane member being selectively positioned in or out of the gap to selectively interrupt the magnetic field between both of the pull position magnets and both of the pull position sensors or between one of the pull position magnets and a respective one of the pull position sensors, or to not interrupt the magnetic field between the pair of pull position magnets and the pair of pull position sensors.

16. The contactless rotary pull switch of claim 13 further comprising a non-ferrous moveable magnet holder drivable by the end member to rotate between a number of positions, wherein the at least one pull position magnet is secured to the non-ferrous moveable magnet holder such that the at least one pull position magnet rotates with the non-ferrous moveable magnet holder.

17. The contactless rotary pull switch of claim 16 wherein the at least one pull position magnet comprises a pair of pull position magnets and the at least one pull position sensor comprises a pair of pull position sensors, and wherein the non-ferrous moveable magnet holder selectively positions the pair of pull position magnets such that neither of the magnetic fields generated by the pair of pull position magnets are sensed by the pair of pull position sensors, one of the magnetic fields generated by the pair of pull position magnets is sensed by a respective pull position sensor, or both of the magnetic fields generated by the pair of pull position magnets are sensed by the pair of pull position sensors.

18. The contactless rotary pull switch of claim 12 further comprising a circuit board positioned within the housing and adjacent the face, the circuit board including the rotational position sensor unit and the at least one pull position sensor thereon; and wherein the circuit board further includes one or more light emitting diodes (LEDs), with the one or more LEDs positioned adjacent the symbols or indicia of the face to provide backlighting thereto.

19. A contactless rotary pull switch for controlling operation of one or more devices in a motor vehicle, the contactless rotary pull switch comprising:

a switch knob assembly that is rotatable about an axis to a plurality of rotational positions and that is movable along the axis to at least one pull position, the switch knob assembly comprising:

a knob element actuatable by an operator; and a rotational shaft fixedly coupled to the knob element so as to rotate and axially translate with the knob element responsive to an actuation thereof, the rotational shaft including an end member formed thereon at an end distal from the knob element;

a multi-pole ring magnet secured to the rotational shaft so as to rotate therewith responsive to a rotation of the knob element;

at least one pull position magnet positioned separately from the rotational position magnet;

a plurality of magnetic sensors positioned to sense magnetic fields generated by the multi-pole ring magnet and the at least one pull position magnet to determine a rotational position and pull position of the switch knob assembly; and an arm member driven by an axial movement of the end member so as to be rotatable between a number of positions to selectively enable and inhibit sensing of the magnetic field generated by the at least one pull position magnet by one or more of respective magnetic sensors, so as to identify distinct pull positions of the switch knob assembly.

20. The contactless rotary pull switch of claim 19 wherein the plurality of magnetic sensors comprises a rotational position sensor unit positioned to sense a magnetic field generated by the multi-pole ring magnet, and wherein the multi-pole ring magnet is further secured to the rotational shaft such that the multi-pole ring magnet is fixedly positioned in an axial direction, such that a distance between the multi-pole ring magnet and the rotational position sensor unit is kept constant during actuation of the switch knob assembly to different pull positions.

* * * * *